(12) United States Patent
Ohta

(10) Patent No.: US 7,750,486 B2
(45) Date of Patent: Jul. 6, 2010

(54) SENSOR DEVICE HAVING STOPPER FOR LIMITTING DISPLACEMENT

(75) Inventor: Tameharu Ohta, Takahama (JP)

(73) Assignee: DENSO CORPORATION, Kariya (JP)

( * ) Notice: Subject to any disclaimer, the term of this patent is extended or adjusted under 35 U.S.C. 154(b) by 79 days.

(21) Appl. No.: 12/078,367

(22) Filed: Mar. 31, 2008

(65) Prior Publication Data

US 2008/0191294 A1    Aug. 14, 2008

Related U.S. Application Data

(62) Division of application No. 11/224,280, filed on Sep. 13, 2005, now Pat. No. 7,385,296.

(30) Foreign Application Priority Data

Sep. 14, 2004    (JP) .............................. 2004-266692

(51) Int. Cl.
*H01L 23/48*    (2006.01)
*H01L 23/52*    (2006.01)
*H01L 29/40*    (2006.01)

(52) U.S. Cl. ........................ 257/784; 257/678; 257/686; 257/724; 257/726; 257/777; 257/E23.002; 257/E23.003

(58) Field of Classification Search .............. None
See application file for complete search history.

(56) References Cited

U.S. PATENT DOCUMENTS

| | | | |
|---|---|---|---|
| 6,476,506 B1 * | 11/2002 | O'Connor et al. ........... | 257/786 |
| 6,593,663 B2 | 7/2003 | Ikezawa et al. .............. | 257/777 |
| 6,759,307 B1 | 7/2004 | Yang ........................... | 438/455 |
| 6,910,898 B2 | 6/2005 | Suzuki et al. ................. | 439/73 |
| 7,078,264 B2 | 7/2006 | Yang ........................... | 438/108 |
| 7,224,070 B2 | 5/2007 | Yang ........................... | 257/777 |
| 2002/0153615 A1 | 10/2002 | Komiyama et al. ......... | 257/777 |
| 2003/0006508 A1 | 1/2003 | Ikezawa et al. .............. | 257/777 |
| 2003/0209789 A1 | 11/2003 | Hanson et al. ............... | 257/678 |
| 2004/0009682 A1 | 1/2004 | Suzuki et al. ................. | 439/73 |
| 2005/0016271 A1 | 1/2005 | Hashimoto et al. ........ | 73/514.14 |
| 2005/0250363 A1 | 11/2005 | Suzuki et al. ............... | 439/266 |

FOREIGN PATENT DOCUMENTS

| | | | |
|---|---|---|---|
| JP | 10-075152 | * | 3/1998 |
| JP | A-10-75152 | | 3/1998 |
| JP | A-11-258261 | | 9/1999 |

OTHER PUBLICATIONS

Office Action dated Sep. 8, 2009 from Japan Patent Office in corresponding JP application No. 2004-266692 (and English translation).

* cited by examiner

*Primary Examiner*—Andy Huynh
*Assistant Examiner*—Hoang-Quan T Ho
(74) *Attorney, Agent, or Firm*—Posz Law Group, PLC

(57) ABSTRACT

A sensor includes: a first chip; a second chip disposed on the first chip through an adhesive member; and a stopper. The second chip is connected to the first chip through a bonding wire. The stopper limits a displacement of the second chip when the adhesive member is deformed. The stopper is disposed around the second chip. Since the displacement of the second chip is restricted, deformation of the bonding wire between the first and the second chips is also restricted.

3 Claims, 8 Drawing Sheets

SENSOR DEVICE HAVING STOPPER FOR LIMITING DISPLACEMENT

CROSS REFERENCE TO RELATED APPLICATION

This application is a divisional of U.S. patent application Ser. No. 11/224,280, filed on Sep. 13, 2005 and entitled SENSOR DEVICE HAVING STOPPER FOR LIMITING DISPLACEMENT, which is based on Japanese patent application No. 2004-266692 filed on Sep. 14, 2004, the contents of both applications being incorporated herein by reference.

FIELD OF THE INVENTION

The present invention relates to a sensor device having a stopper for limiting a displacement.

BACKGROUND OF THE INVENTION

A sensor device includes a sensor chip and a circuit chip, which are laminated through an adhesive material and connected through a bonding wire. This type of sensor device has a construction in which the sensor chip is laminated and adhered onto the circuit chip through the adhesive material, and the sensor chip and the circuit chip are connected to each other through the bonding wire.

For example, a structure for mounting the sensor chip onto the circuit chip through the adhesive material of a film shape is proposed as such a sensor device to reduce an output change with respect to a temperature change of the sensor chip for the purpose of a reduction in thermal stress of its joining portion. This structure is disclosed in, for example, U.S. Pat. No. 6,593,663.

However, in the structure of the sensor device of this kind, when the adhesive material such as the film shape adhesive material for adhering a portion between the chips has low elasticity, the rigidity of the joining portion of the sensor chip and the circuit chip is reduced, so that the sensor chip is easily greatly displaced by an impact from the exterior.

Therefore, the problems that the bonding wire for electrically connecting both the chips is easily deformed with respect to the deformation of this sensor chip and is disconnected in its turn, are caused.

In particular, in the case of a physical amount sensor of a capacity type for converting a physical amount into a capacity change by the sensor chip and detecting the physical amount, the parasitic capacity between adjacent wires, or between the wires and the chips affects sensor characteristics.

Therefore, the deformation of the bonding wire caused by excessively displacing the sensor chip causes a change in the above parasitic capacity as well as mechanical deformation including the disconnection of the wire. Therefore, the problem of a change in sensor chip characteristics is caused.

SUMMARY OF THE INVENTION

In view of the above-described problem, it is an object of the present invention to provide a sensor device having a stopper for limiting a displacement.

A sensor includes: a first chip; a second chip disposed on the first chip through an adhesive member; and a stopper. The second chip is connected to the first chip through a bonding wire. The stopper limits a displacement of the second chip when the adhesive member is deformed. The stopper is disposed around the second chip.

Since the displacement of the second chip is restricted, deformation of the bonding wire between the first and the second chips is also restricted. Thus, mechanical strength of the bonding wire is improved. Further, since the deformation of the bonding wire is limited, deviation of sensor characteristics caused by the deformation of the bonding wire becomes smaller. Thus, the sensor characteristics is improved.

Preferably, the first chip is a circuit chip, and the second chip is a sensor chip.

Preferably, the stopper is a bonding wire disposed on a part of the first chip, the part being disposed outside of a periphery of the second chip. More preferably, the second chip has a rectangular shape, and the bonding wire of the stopper has an inverted horseshoe arch shape, and is disposed outside of a corner of the rectangular shape of the second chip. Furthermore preferably, the bonding wire of the stopper has two ends, each of which is connected to a surface of the first chip.

Preferably, the stopper is a stud bump disposed on a part of the first chip, the part being disposed outside of a periphery of the second chip. More preferably, the second chip has a rectangular shape, and the stud bump of the stopper includes a pair of bumps, which are close to one another and disposed outside of a corner of the rectangular shape of the second chip. Furthermore preferably, the bumps of the stopper are disposed on a surface of the first chip.

Preferably, the stopper is a solder bump disposed on a part of the first chip, the part being disposed outside of a periphery of the second chip. More preferably, the second chip has a rectangular shape, and the solder bump of the stopper is disposed outside of a side of the rectangular shape of the second chip. Furthermore preferably, the solder bump is disposed on a surface of the first chip.

Preferably, the stopper is a resin member disposed on a part of the first chip, the part being disposed outside of a periphery of the second chip. More preferably, the second chip has a rectangular shape, and the resin member of the stopper has an elongated shape, and is disposed outside of a side of the rectangular shape of the second chip. Furthermore preferably, the resin member is disposed on a surface of the first chip.

Preferably, the stopper is a large wire, which connects between the first chip and the second chip, and the large wire has a diameter larger than that of the bonding wire. More preferably, the second chip has a rectangular shape, and the larger wire of the stopper is disposed on a corner of the rectangular shape of the second chip.

Preferably, the sensor further includes a package. The first chip is mounted on the package, and the stopper is a wire, which connects between the second chip and the package. More preferably, the second chip has a rectangular shape, and the wire of the stopper is disposed on a corner of the rectangular shape of the second chip.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
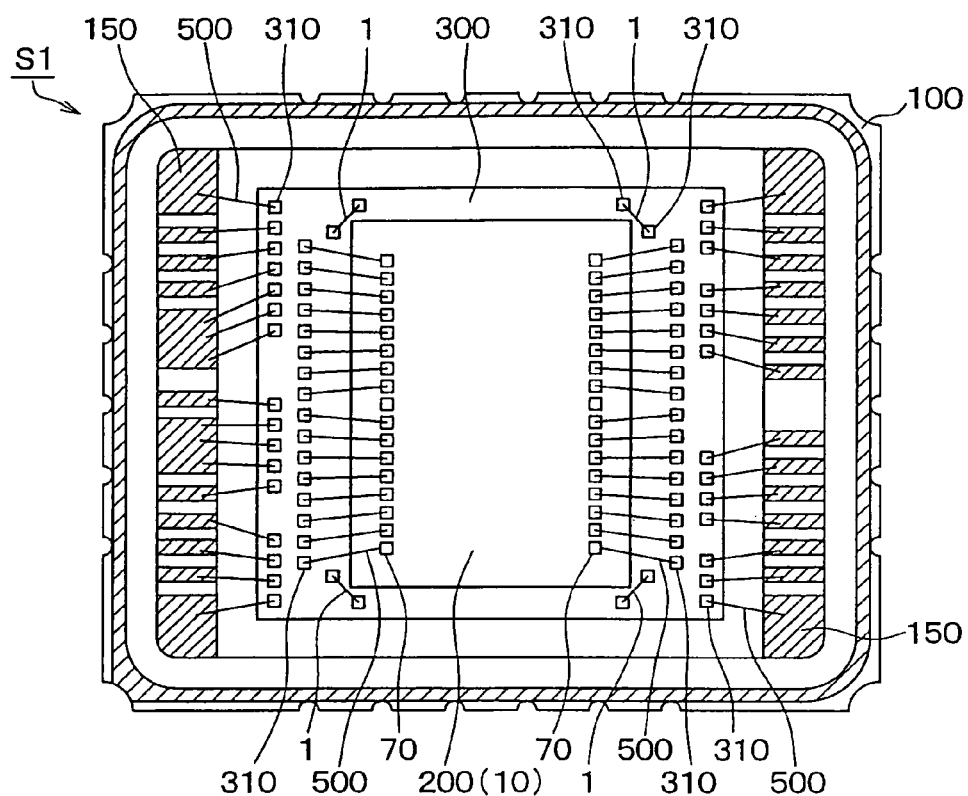
FIG. 1A is a plan view showing an angular rate sensor device according to a first embodiment of the present invention.
Figure 1B:
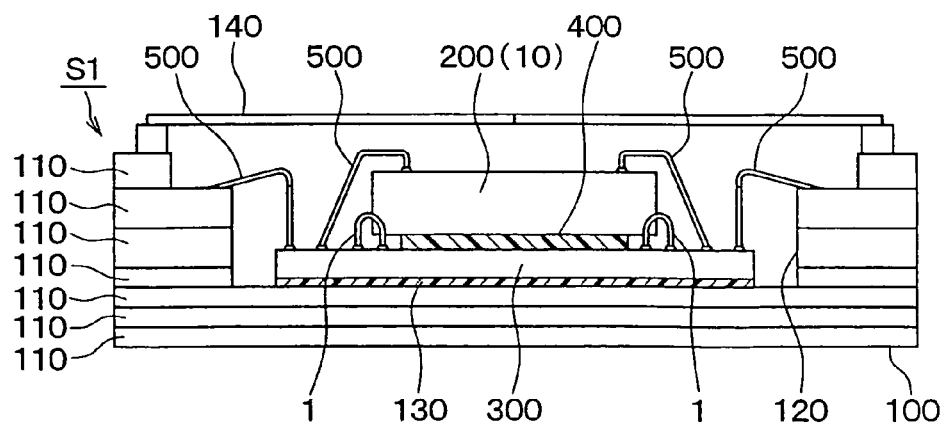
FIG. 1B is a cross sectional view showing the device in FIG. 1A.

FIGS. 1A and 1B are views showing the construction of an angular rate sensor device S1 as a sensor device in accordance with a first embodiment mode of the present invention. FIG. 1A is a schematic plan view of this sensor device S1. FIG. 1B is a schematic sectional view of this sensor device S1. FIG. 1A is a view in which a structure in a state detaching a cover 140 is seen from above the sensor device of FIG. 1B.

As shown in FIGS. 1A and 1B, this sensor device S1 mainly has a package 100, a circuit chip 300 held in the package 100, a sensor chip 200 laminated and adhered to the circuit chip 300 through an adhesive material 400 and detecting an angular rate, and a bonding wire 500 for connecting both the chips 200 and 300.

The package 100 stores both the chips 200 and 300, and forms a base portion for partitioning and forming a main body of the sensor device S1. The package 100 is arranged to attach the sensor device S1 to a suitable place of a measuring object body.

In the example shown in FIGS. 1A and 1B, for example, the package 100 is constructed as a laminating substrate in which plural ceramic layers 110 of e.g., alumina are laminated. Wiring is formed on the surface of each layer 110 and the interior of a through hole formed in each layer although this wiring is unillustrated. The sensor device S1 and the exterior circuit can be electrically connected through this wiring.

The package 100 also has a concave portion 120 able to store the circuit chip 300 in its bottom portion. As shown in FIG. 1B, the circuit chip 300 stored in this concave portion 120 is mounted and fixed onto the bottom portion of the package 100 through an adhesive 130 constructed from e.g., an unillustrated silicon system resin, etc.

A cover (lid) 140 constructed by a metal, resin or ceramic, etc. is attached to an opening portion of the package 100. The interior of the package 100 is sealed by this cover 140. Here, the cover 140 is constructed by a metal, and is joined to the package 100 by welding, brazing, etc.

The sensor chip 200 is laminated on the upper face of the circuit chip 300 through the adhesive material 400. An adhesive material such as resin, etc. can be adopted as the adhesive material 400. However, in this example, a film shape adhesive material of low elasticity is adopted from a purpose similar to that in the conventional device. Needless to say, an adhesive material of comparatively high elasticity may be also adopted.

For example, this film shape adhesive material 400 can be constructed by resin, etc. fulfilling an adhesive function by pressurizing and hardening this material. Concretely, for example, a silicon system, an epoxy system, a polyimide system, an acrylic system, a urethane system, a rubber system, a liquid crystal polymer, etc. are used as the film shape adhesive material 400.

The sensor chip 200 is constructed as a detecting element for detecting an angular rate. For example, the sensor chip 200 provides a beam structural body having a comb teeth structure generally known with respect to a silicon substrate, etc. The sensor chip 200 can be set to detect a change in electrostatic capacity (electric signal) between a movable electrode and a fixing electrode according to the applied angular rate.

The detailed construction of the sensor chip 200 as the angular rate detecting element of this example will be mainly explained with reference to FIG. 2.

Figure 2:
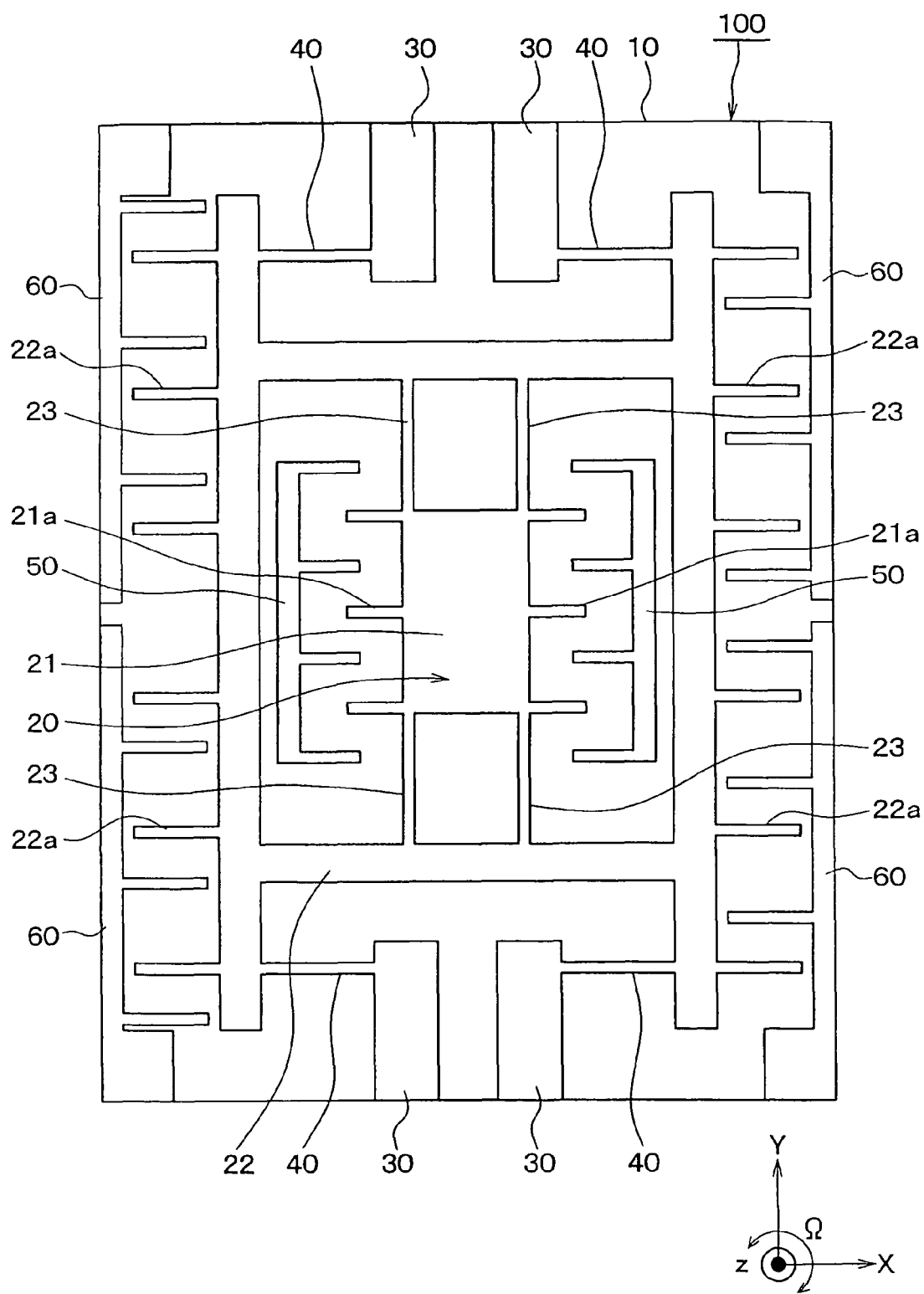
FIG. 2 is a plan view showing a sensor chip of the device according to the first embodiment.

FIG. 2 is a view showing the schematic planar construction of the sensor chip 200 in the angular rate sensor device S1 shown in FIGS. 1A and 1B. FIG. 2 is a schematic plan view seen from the lower face of a substrate 10 constituting the sensor chip 200 in FIG. 1B.

This sensor chip 200 has the substrate 10 such as a semiconductor substrate, etc., and is formed by performing publicly known micro machine processing with respect to this substrate 10.

For example, as the substrate 10, it is possible to adopt a SOI (silicon-on-insulator) substrate of a rectangular shape in which a second silicon layer as a second semiconductor layer is stuck onto a first silicon layer as a first semiconductor layer through an oxide film as an insulating layer.

As shown in FIG. 2, beam structural bodies 20 to 60 partitioned by grooves are formed by performing trench etching, release etching, etc. with respect to a surface layer of this substrate 10, e.g., the second silicon layer in the SOI substrate.

These beam structural bodies 20 to 60 are mainly constructed from a vibrating body 20, respective beam portions 23, 40 and respective electrodes 50, 60.

The vibrating body 20 is formed in the central portion of the substrate 10 so as to be vibrated within a face horizontal to the substrate 10, i.e., within the paper face within FIG. 2. In this example, the vibrating body 20 is constructed from a first vibrating portion 21 located in the central portion and approximately formed in a rectangular shape, a second vibrating portion 22 located in the outer circumference of this first vibrating portion 21 and formed in the shape of a rectangular frame, and a driving beam portion 23 for connecting these first vibrating portion 21 and second vibrating portion 22.

This vibrating body 20 is connected to an anchor portion 30 arranged in a circumferential portion of the substrate 10 through a detecting beam portion 40. Here, the anchor portion 30 is fixed and supported in the lower portion of the surface layer forming this beam structural body 20 therein, i.e., in a support substrate portion in the substrate 10. The vibrating body 20 is floated from this support substrate portion.

Here, as shown in FIG. 2, for example, the driving beam portion 23 can be elastically deformed substantially in only the x-direction by forming the driving beam portion 23 in a shape extending in the y-direction. For example, the detecting beam portion 40 can be elastically deformed substantially in only the y-direction by forming the detecting beam portion 40 in a shape extending in the x-direction.

The first vibrating portion 21 in the vibrating body 20 can be vibrated by the driving beam portion 23 in the x-direction (driving vibrating direction) within the horizontal face with respect to the substrate 10. On the other hand, the entire vibrating body 20 can be vibrated by the detecting beam portion 40 in the y-direction (detecting vibrating direction) within the horizontal face with respect to the substrate 10.

The driving electrode 50 for operating and vibrating the first vibrating portion 21 in the x-direction is arranged between the first vibrating portion 21 and the second vibrating portion 22. Similarly to the anchor portion 30, this driving electrode 50 is fixed to the above support substrate portion. The driving electrode 50 is arranged so as to be opposed to a comb teeth portion (comb teeth portion for driving) 21a projected from the first vibrating portion 21 such that their comb teeth are engaged with each other.

The detecting electrode 60 is arranged in the outer circumference of the second vibrating portion 22. This detecting electrode 60 is arranged to detect an angular rate around the z-axis perpendicular to the substrate 10 on the basis of the vibration of the vibrating body 20. Similarly to the anchor portion 30, the detecting electrode 60 is fixed to the above support substrate portion. The detecting electrode 60 is arranged so as to be opposed to a comb teeth portion (comb teeth portion for detection) 22a projected from the second vibrating portion 22 such that their comb teeth are engaged with each other.

As shown in FIG. 1A, plural pads 70 are arranged in a suitable place of the substrate 10 in this sensor chip 200 although the pads 70 are not illustrated in FIG. 2. The pad 70 is constructed by aluminum, etc. to apply voltages to the above vibrating body 20, the driving electrode 50, the detecting electrode 60, etc. and take out signals.

In this embodiment mode, as shown in FIG. 1A, this pad 70 is arranged in the circumferential portion of the substrate 10. The bonding wire 500 of Au (gold), aluminum, etc. is connected to this pad 70. This sensor chip 200 has the above-mentioned construction.

Here, for example, the circuit chip 300 is an IC chip, etc. in which a MOS transistor, a bipolar transistor, etc. are formed by using a publicly known semiconductor process with respect to a silicon substrate, etc. The circuit chip 300 can be set to a signal processing chip having functions for sending a voltage to the sensor chip 200 and processing an electric signal from the sensor chip 200 and outputting the electric signal to the exterior, etc.

As shown in FIGS. 1A and 1B, the pad 70 of the sensor chip 200 and a pad 310 of the circuit chip 300, and the pad 310 of the circuit chip 300 and a pad 150 of the package 100 are respectively electrically connected through the bonding wire 500 constructed by gold, aluminum, etc.

Thus, the sensor chip 200, the circuit chip 300 and the package 100 are electrically connected to each other through the bonding wire 500. The sensor chip 200 and the circuit chip 300 may not be directly connected to the bonding wire 500 as shown in FIGS. 1A and 1B.

For example, the sensor chip 200 and the package 100 may be connected by the bonding wire 500, and the package 100 and the circuit chip 300 may be also connected by the bonding wire 500. In this case, the sensor chip 200 and the circuit chip 300 are unchangingly connected through the bonding wire 500 although the package 100 is interposed.

Thus, an electric signal (capacity change) from the sensor chip 200 is sent to the circuit chip 300 and is converted into a voltage signal by a C/V converting circuit, etc. arranged in the circuit chip 300, and is outputted as an angular rate signal.

As shown in FIGS. 1A and 1B, in this embodiment mode, a stopper 1 for regulating the displacement of the sensor chip 200 due to the deformation of the adhesive material 400 interposed between the chips 200 and 300 is arranged around the sensor chip 200.

In this embodiment mode, the stopper 1 is a wire 1 (hereinafter called a stopper wire 1) constructed by a bonding wire arranged in a part located in the outer circumference of the sensor chip 200 in the circuit chip 300.

Similarly to the above bonding wire 500, this stopper wire 1 can be formed by performing the wire bonding of gold, aluminum, etc. between the pads 310 on the circuit chip 300.

In this example, the film shape adhesive material 400 of low elasticity is adopted from a purpose similar to that of the conventional device. Therefore, the sensor chip 200 is easily displaced by an external impact, etc. in the planar direction on the circuit chip 300.

Here, as shown in FIG. 1B, the stopper wire 1 has a loop height higher than the thickness of the adhesive material 400. Even when the sensor chip 200 is greatly displaced in the above planar direction, the sensor chip 200 hits against this stopper wire 1 and is stopped.

A manufacturing method of this sensor device S1 having such a construction will be explained with reference to FIGS. 3A, 3B, 3C and 4A, 4B, 4C. FIGS. 3A, 3B, 3C and 4A, 4B, 4C are process views for explaining this manufacturing method, and are schematic plan views in which a work in each manufacturing process is seen from the same eye point as the above FIG. 1A.

Figure 3A:
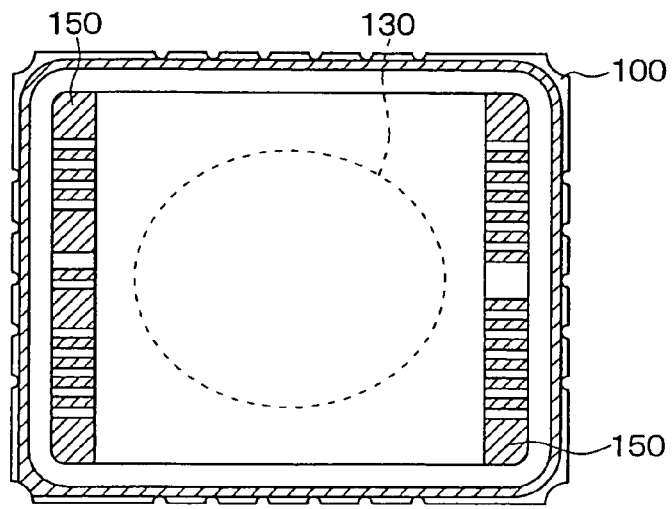
FIGS. 3A to 3C are plan views explaining a method for manufacturing the device according to the first embodiment.
Figure 3B:
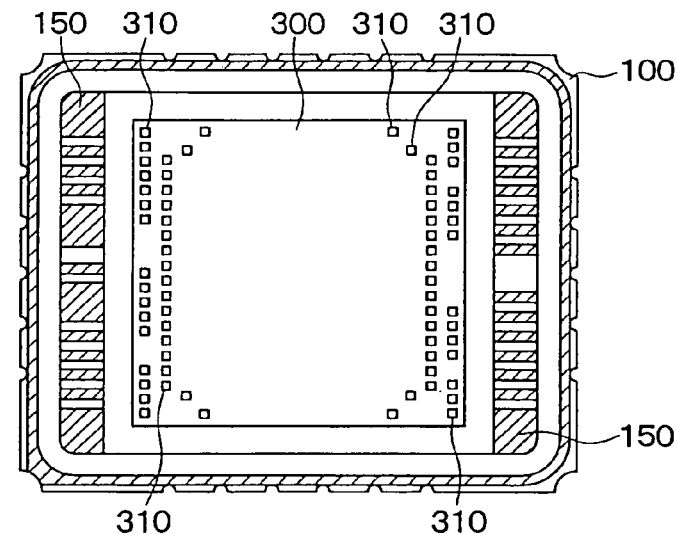

First, as shown in FIG. 3A, the bottom portion of the package 100 is coated with an adhesive 130. As shown in FIG. 3B, a circuit chip 300 is mounted onto this adhesive 130, and the circuit chip 300 and the package 100 are adhered by the adhesive 130.

Figure 3C:
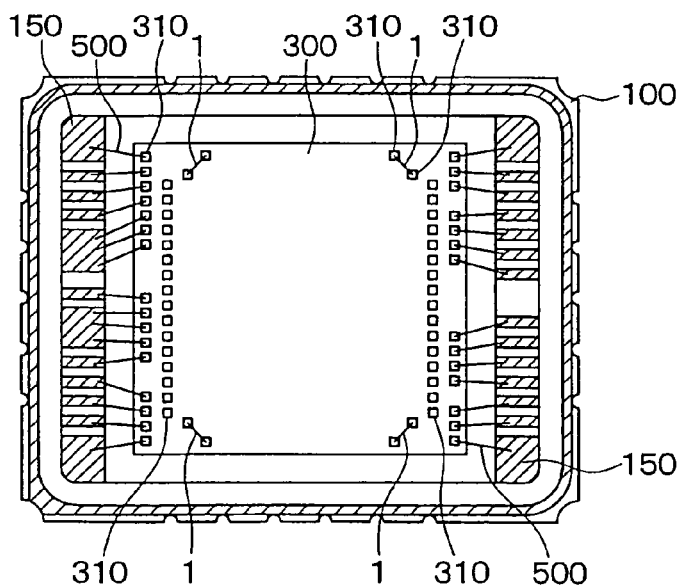

Thereafter, as shown in FIG. 3C, the pad 150 of the package 100 and the pad 310 of the circuit chip 300 are connected by the bonding wire 500 by performing the wire bonding.

Next, the wire bonding is performed between the pads 310 for the stopper wire 1 arranged on the circuit chip 300 by the same wire bonding process, and these pads 310 are connected by the stopper wire 1.

Figure 4A:
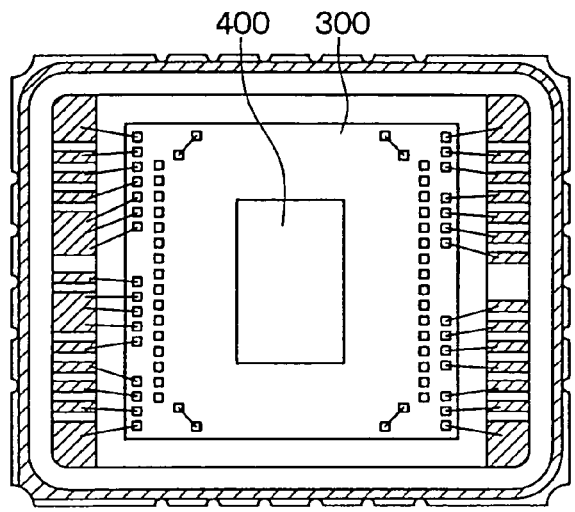
FIGS. 4A to 4C are plan views explaining the method for manufacturing the device according to the first embodiment.
Figure 4B:
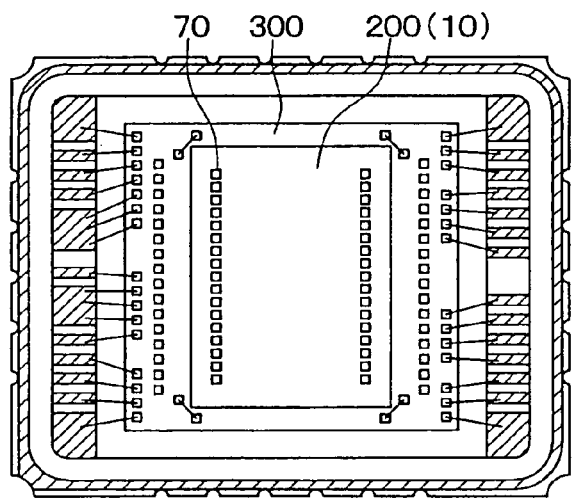

After this wire bonding is completed, the adhesive material 400 is mounted onto the circuit chip 300 as shown in FIG. 4A. As shown in FIG. 4B, the sensor chip 200 is mounted onto this adhesive material 400. Thereafter, the adhesive material 400 is hardened so that the sensor chip 200 and the circuit chip 300 are adhered.

Figure 4C:
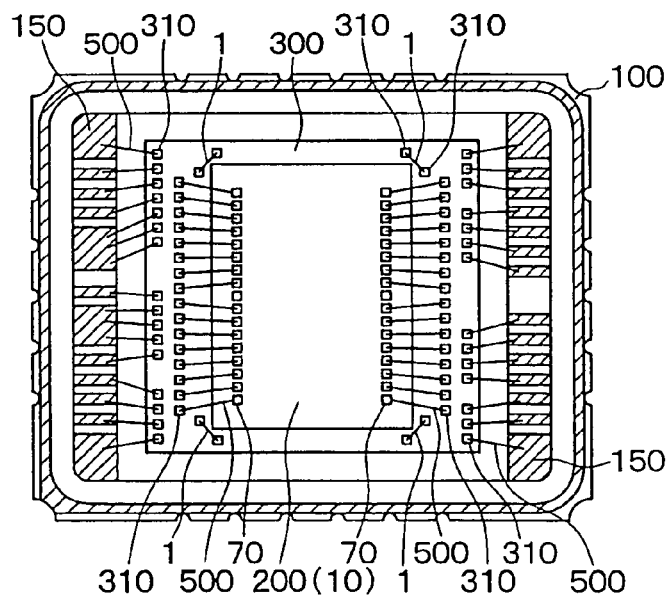

As shown in FIG. 4C, the pad 70 of the sensor chip 200 and the pad 310 of the circuit chip 300 are connected by the bonding wire 500. Thereafter, the cover 140 (see FIG. 1B) is welded and brazed to the package 100 so that the interior of the package 100 is sealed. Thus, the angular rate sensor device S1 is completed.

The detecting operation of such an angular rate sensor device S1 will be explained. With reference to FIG. 2, electrostatic force is generated between the comb teeth portion 21a of the first vibrating portion 21 and the driving electrode 50 by applying a driving signal (sine wave voltage, etc.) from the circuit chip 300 to the driving electrode 50 of the sensor chip 200 through the bonding wire 500. Thus, the first vibrating portion 21 is operated and vibrated in the x-direction by the elastic force of the driving beam portion 23.

When an angular rate $\Omega$ is applied around the z-axis on the basis of the operation and vibration of this first vibrating portion 21, Coriolis force is applied to the first vibrating portion 21 in the y-direction and the entire vibrating body 20 is detection-vibrated by the elastic force of the detecting beam portion 40 in the y-direction.

Thus, the capacity between the detecting electrode 60 and the comb teeth of the comb teeth portion 22a for detection is changed by this detection vibration. Therefore, the magnitude of the angular rate Ω can be calculated by detecting this capacity change.

Concretely, when the vibrating body 20 is displaced in one direction along the y-axis direction in FIG. 2, the capacity changes in the detecting electrode 60 of the left-hand side and the detecting electrode 60 of the right-hand side are set to be reverse to each other in the left and right detecting electrodes 60 in FIG. 2. Therefore, the angular rate is calculated by converting the respective capacity changes in the left and right detecting electrodes 60 into voltages, and differentiating, amplifying and outputting both the voltage values.

In accordance with this embodiment mode, the sensor chip 200 is laminated and adhered onto the circuit chip 300 through the adhesive material 400, and the sensor chip 200 and the circuit chip 300 are connected through the bonding wire 500 in the sensor device S1. This sensor device S1 is characterized in that the stopper 1 for regulating the displacement of the sensor chip 200 due to the deformation of the adhesive material 400 is arranged around the sensor chip 200.

In accordance with this construction, even when the sensor chip 200 is intended to be greatly displaced by the deformation of the adhesive material 400, the displacement of the sensor chip 200 is regulated by hitting against the stopper 1. Therefore, the deformation of the bonding wire 500 connecting the sensor chip 200 and the circuit chip 300 is also restrained.

Accordingly, in accordance with the sensor device S1 of this embodiment mode, the mechanical deformation of a wire connecting portion caused by excessively displacing the sensor chip 200 and a change in sensor characteristics collaterally caused by this mechanical deformation can be restrained in the sensor device having the circuit chip 300 and the sensor chip 200 laminated through the adhesive material 400 and connected through the bonding wire 500.

In particular, in this embodiment mode, it is also characterized in that the stopper 1 is the wire 1 constructed by a bonding wire arranged in a part located in the outer circumference of the sensor chip 200 in the circuit chip 300.

As shown in FIGS. 1A and 1B, the stopper wire 1 functioning as the stopper is stretched in a shape close to the sensor chip 200. When force such as an impact, etc. is applied to the chip 200, the displacement of the sensor chip 200 is limited by the wire 1.

Thus, the deformation of the bonding wire 500 connecting the chips 200 and 300 is limited so that a change in a characteristic value of the sensor can be restrained by the above reasons.

No timing for forming the stopper wire 1 of this embodiment mode on the circuit chip 300 is limited to the manufacture processes shown in FIGS. 3A, 3B, 3C and 4A, 4B, 4C.

For example, the stopper wire 1 may be also formed before the wire bonding between the sensor chip 200 and the circuit chip 300 is performed. The stopper wire 1 may be also formed in performing the wire bonding between the circuit chip 300 and the package 100.

Second Embodiment

Figure 5A:
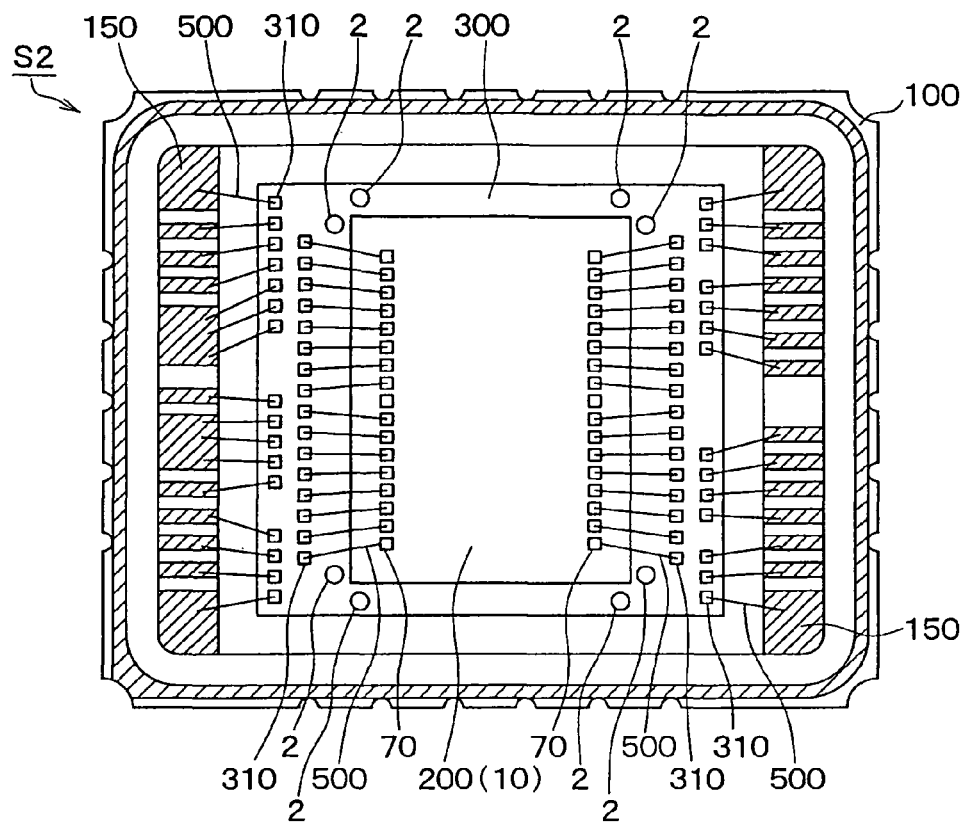
FIG. 5A is a plan view showing an angular rate sensor device according to a second embodiment of the present invention.
Figure 5B:
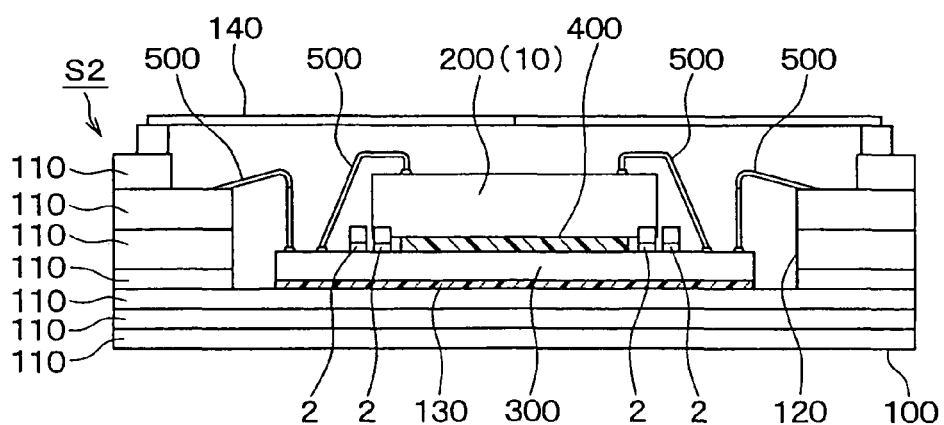
FIG. 5B is a cross sectional view showing the device in FIG. 5A.

FIGS. 5A and 5B are views showing the construction of an angular rate sensor device S2 as a sensor device in accordance with a second embodiment mode of the present invention. FIG. 5A is a schematic plan view of this sensor device S2. FIG. 5B is a schematic sectional view of this sensor device S2. FIG. 5A is a view in which a structure with the cover 140 removed is seen from above the sensor device of FIG. 5B.

In the above first embodiment mode, the stopper is formed by stretching the wire 1 on the circuit chip 300. However, it is not necessarily indispensable that the wire 1 is stretched to obtain a similar effect by forming the stopper on the circuit chip 300.

This embodiment mode provides the sensor device S2 characterized in that the stopper is constructed by a stud bump 2 arranged in a part located in the outer circumference of the sensor chip 200 in the circuit chip 300.

Concretely, as shown in FIGS. 5A and 5B, the stud bump 2 is formed by performing preball bonding in the wire bonding of gold, etc. on the circuit chip 300. This stud bump 2 is used as a stopper. Concretely, after the ball bonding is performed, the wire is cut so that the stud bump 2 is formed.

In this embodiment mode, the effect of the stopper similar to that of the first embodiment mode is obtained and the stopper 2 can be easily formed in the wire bonding process between the chips 200 and 300.

This stud bump 2 is naturally higher than the thickness of the adhesive material 400. The ball bonding may be also performed plural times to form the stud bump 2 of such a height. Namely, the stud bump 2 may be constructed by a simple layer and may be also constructed by a structure formed by laminating many layers.

Third Embodiment

Figure 6A:
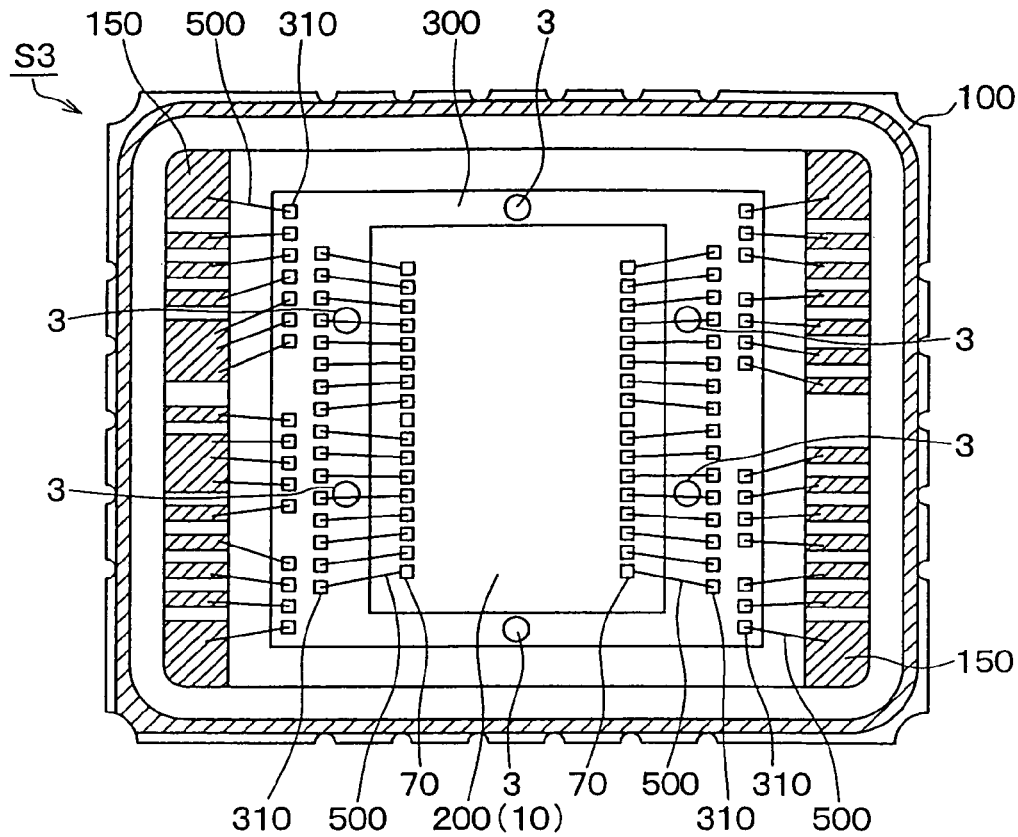
FIG. 6A is a plan view showing an angular rate sensor device according to a third embodiment of the present invention.
Figure 6B:
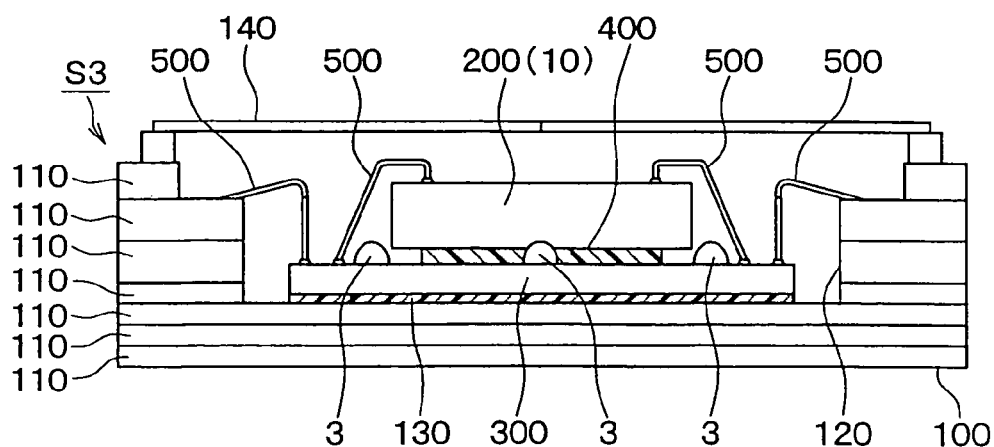
FIG. 6B is a cross sectional view showing the device in FIG. 6A.

FIGS. 6A and 6B are views showing the construction of an angular rate sensor device S3 as a sensor device in accordance with a third embodiment mode of the present invention. FIG. 6A is a schematic plan view of this sensor device S3. FIG. 6B is a schematic sectional view of this sensor device S3. FIG. 6A is a view in which a structure with the cover 140 removed is seen from above the sensor device of FIG. 6B.

In the second embodiment mode, the stopper is constructed by the stud bump 2 arranged in the part located in the outer circumference of the sensor chip 200 in the circuit chip 300. However, as shown in FIGS. 6A and 6B, the sensor device S3 of this embodiment mode is characterized in that a soldering bump 3 is used instead of the stud bump.

Concretely, as shown in FIGS. 5A and 5B, an unillustrated electrode is arranged on the circuit chip 300. The soldering bump 3 is formed on this electrode by plating solder and printing solder. The soldering bump 3 can be also formed by a method for arranging a soldering ball itself, etc.

In this embodiment mode, the effect of the stopper similar to that in the first embodiment mode is obtained by operating this soldering bump 3 as the stopper.

Fourth Embodiment

Figure 7A:
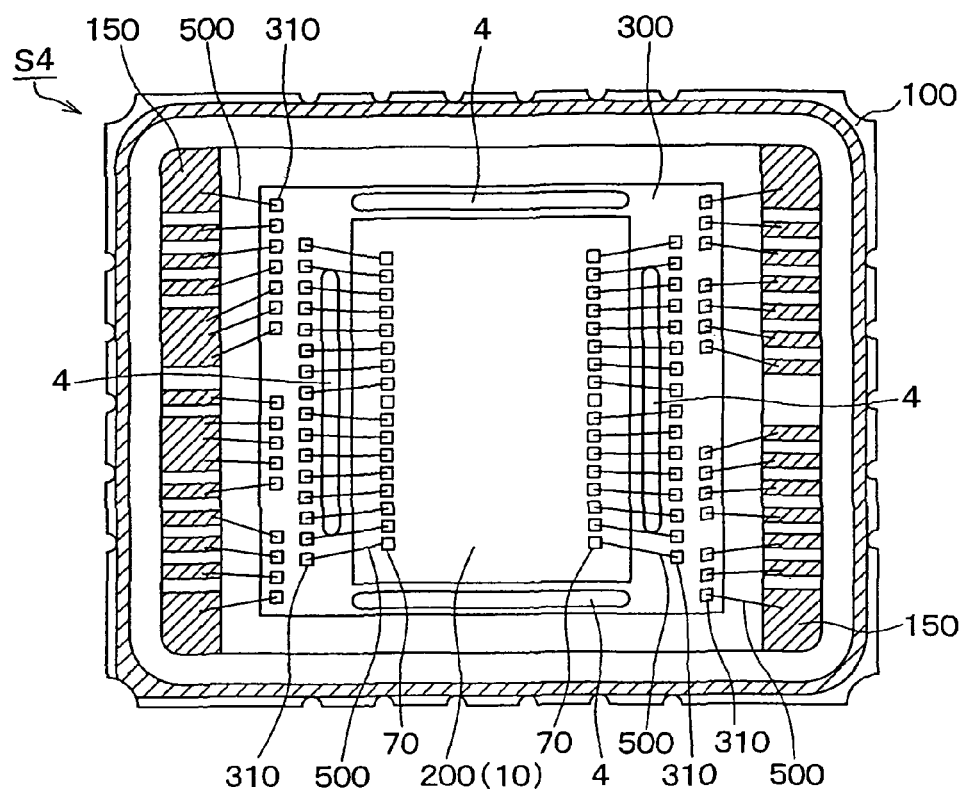
FIG. 7A is a plan view showing an angular rate sensor device according to a fourth embodiment of the present invention.
Figure 7B:
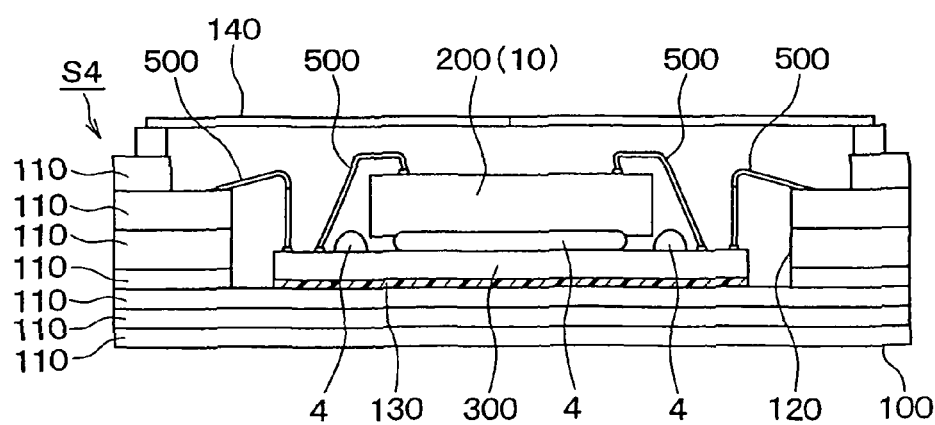
FIG. 7B is a cross sectional view showing the device in FIG. 7A.

FIGS. 7A and 7B are views showing the construction of an angular rate sensor device S4 as a sensor device in accordance with a fourth embodiment mode of the present invention. FIG. 7A is a schematic plan view of this sensor device S4. FIG. 7B is a schematic sectional view of this sensor device S4. FIG. 7A is a view in which a structure with the cover 140 removed is seen from above the sensor device of FIG. 7B.

As shown in FIGS. 7A and 7B, this embodiment mode provides the sensor device S4 characterized in that the stopper is constructed by a resin member 4 arranged in a part located in the outer circumference of the sensor chip 200 in the circuit chip 300.

Concretely, as shown in FIGS. 7A and 7B, resin paste, etc. are formed on the circuit chip 300 in a dam shape by an ink jet, dispensing, etc. The resin member 4 of the dam shape is formed by hardening this resin paste, etc.

In this embodiment mode, the effect of the stopper similar to that in the above first embodiment mode is also obtained by operating this resin member 4 as the stopper.

Fifth Embodiment

Figure 8:
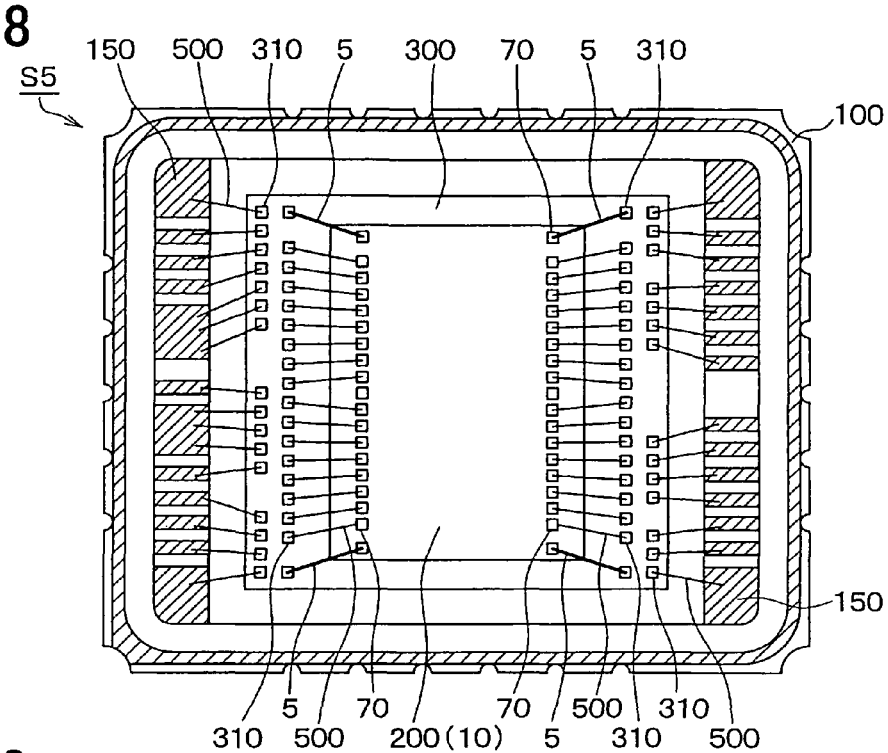
FIG. 8 is a plan view showing an angular rate sensor device according to a fifth embodiment of the present invention.

FIG. 8 is a view showing the schematic planar construction of an angular rate sensor device S5 as a sensor device in accordance with a fifth embodiment mode of the present invention. The cover 140 is set to a detaching state.

As shown in FIG. 8, this embodiment mode provides the sensor device S5 characterized in that the stopper is constructed by setting a partial wire 5 of the bonding wire 500 for connecting the sensor chip 200 and the circuit chip 300 to be thicker than the other wire 500.

For example, the wire 5 (here called an anchor wire 5) as this stopper can be formed by the wire bonding after the sensor chip 200 and the circuit chip 300 are laminated and adhered, and before or after the wire bonding between the sensor chip 200 and the circuit chip 300 is performed.

For example, this anchor wire 5 can be easily set to be thicker than the other wire of the bonding wire 500 for connecting both the chips 200 and 300 in the embodiment mode by setting the thinner wire to a gold thin wire and setting the thicker wire to an aluminum thick wire, or changing the diameter of the wire even in the wire of the same material, etc.

In this embodiment mode, this anchor wire 5 acts as the stopper. Here, the displacement of the sensor chip 200 itself is regulated by the comparatively thick anchor wire 5. Thus, in this embodiment mode, similarly to the first embodiment mode, it is also possible to restrain the mechanical deformation of a wire connecting portion caused by excessively displacing the sensor chip 200 and a change in sensor characteristics collaterally caused by this mechanical deformation.

Sixth Embodiment

Figure 9:
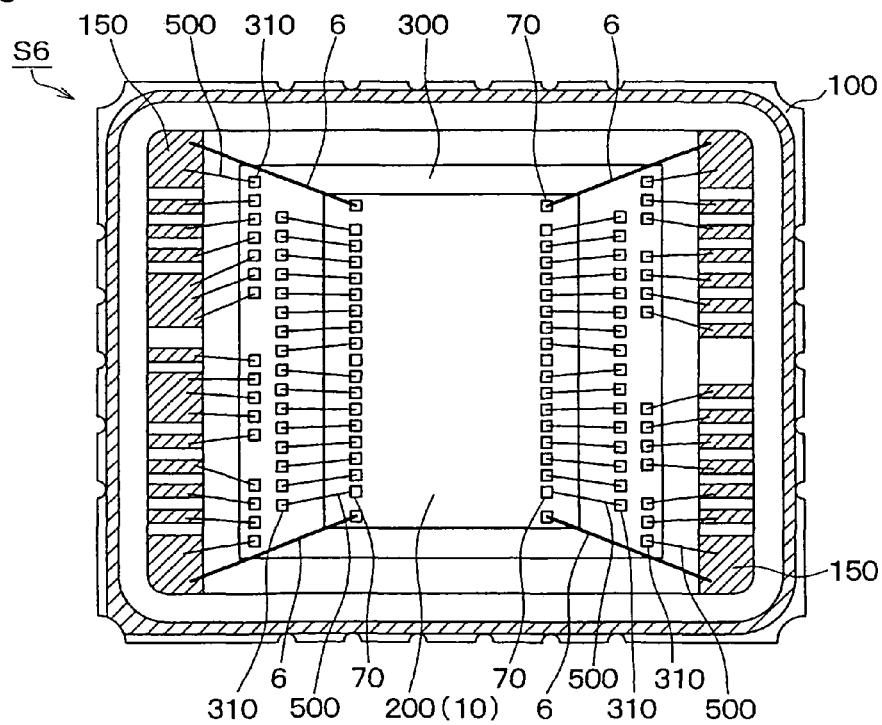
FIG. 9 is a plan view showing an angular rate sensor device according to a sixth embodiment of the present invention.

FIG. 9 is a view showing the schematic planar construction of an angular rate sensor device S6 as a sensor device in accordance with a sixth embodiment mode of the present invention. The cover 140 is set to a detaching state.

As shown in FIG. 9, this embodiment mode provides the sensor device S6 characterized in that the circuit chip 300 is mounted and fixed onto the package 100, and the stopper is constructed as a wire 6 for connecting the sensor chip 200 and the package 100.

For example, the wire 6 as this stopper can be formed at any time point after the sensor chip 200 and the circuit chip 300 are laminated and adhered within the package 100.

The wire 6 of this embodiment mode can be also set to take an action similar to that of the anchor wire of the above fifth embodiment mode, and is constructed as a comparatively thick wire by changing the material and the wire diameter.

Therefore, in this embodiment mode, similarly to the first embodiment mode, it is also possible to restrain the mechanical deformation of a wire connecting portion caused by excessively displacing the sensor chip 200 and a change in sensor characteristics collaterally caused by this mechanical deformation.

(Modifications)

The angular rate sensor device has been explained as an example as the sensor device of the present invention. However, the present invention is not limited to the angular rate sensor, but can be also applied to an acceleration sensor, a pressure sensor, a temperature sensor, a humidity sensor, an optical sensor, an image sensor, etc.

Namely, in the embodiment modes, the sensor chip 200 may be also an acceleration detecting element, a pressure detecting element, a temperature detecting element, a humidity detecting element, an optical detecting element and an image detecting element.

The circuit chip may be any chip of a circuit using a MOS transistor, a bipolar transistor, etc., a memory circuit, etc.

In short, in the sensor device in which the sensor chip is laminated and adhered onto the circuit chip through the adhesive material, and the sensor chip and the circuit chip are connected through the bonding wire, the present invention has a main portion in which the stopper for regulating the displacement of the sensor chip due to the deformation of the adhesive material is arranged around the sensor chip. The other portions can be suitably changed in design.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A sensor comprising:
   a first chip;
   a second chip disposed on the first chip through an adhesive member; and
   a stopper, wherein
   the second chip is connected to the first chip through a bonding wire,
   the stopper is disposed and configured to limit a displacement of the second chip when the adhesive member is deformed,
   the stopper is disposed adjacent to the second chip,
   the stopper is a stopper wire, and
   the stopper wire is thicker than the bonding wire, the sensor further including
   a package, wherein
   the first chip is mounted on the package, and
   the stopper connects between the second chip and the first chip.

2. The sensor according to claim 1, wherein
   the first chip has a rectangular shape,
   the second chip has a rectangular shape,
   the stopper further includes three stopper wires, and
   each stopper wire is configured to connect between a corresponding corner of the first chip and a corresponding corner of the second chip.

3. The sensor according to claim 2, wherein
   the rectangular shape of the second chip is larger than the rectangular shape of the first chip, and
   the rectangular shape of the package is larger than the rectangular shape of the second chip.

* * * * *